United States Patent
Takahashi et al.

(10) Patent No.: US 6,870,718 B2
(45) Date of Patent: Mar. 22, 2005

(54) MAGNETORESISTIVE SENSOR INCLUDING MAGNETIC DOMAIN CONTROL LAYERS HAVING HIGH ELECTRIC RESISTIVITY

(75) Inventors: Hiromasa Takahashi, Hachioji (JP); Reiko Arai, Kokubunji (JP); Susumu Soeya, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 161 days.

(21) Appl. No.: 09/811,606

(22) Filed: Mar. 20, 2001

(65) Prior Publication Data

US 2002/0003685 A1 Jan. 10, 2002

(30) Foreign Application Priority Data

Jul. 6, 2000 (JP) .................................. 2000-210704

(51) Int. Cl.[7] .......................... G11B 5/127; G11B 5/33
(52) U.S. Cl. ................................................ 360/327.3
(58) Field of Search ........................ 360/327.3, 327.31, 360/327.32, 327, 321, 324.12, 313, 320, 110, 324.2

(56) References Cited

U.S. PATENT DOCUMENTS

| | | | |
|---|---|---|---|
| 5,729,410 A | * | 3/1998 | Fontana et al. .......... 360/324.2 |
| 6,449,135 B1 | * | 9/2002 | Ding et al. ............. 360/327.31 |
| 6,633,466 B2 | * | 10/2003 | Sakaguci et al. ...... 360/327.31 |
| 2001/0021089 A1 | * | 9/2001 | Miyauchi et al. ........ 360/324.2 |

FOREIGN PATENT DOCUMENTS

| JP | 4-358310 | | 12/1992 |
|---|---|---|---|
| JP | 04 358310 | * | 12/1992 |
| JP | 05 266437 | * | 10/1993 |
| JP | 5-266437 | | 10/1993 |
| JP | 09 282618 | * | 10/1997 |
| JP | 9-282618 | | 10/1997 |
| JP | 11-316919 | | 11/1999 |
| JP | 2000-101164 | | 4/2000 |
| JP | 2001-250208 | | 9/2001 |

OTHER PUBLICATIONS

Tehrani, et al., "Progress and Outlook for MRAM Technology ", IEEE Transactions on Magnetics, vol. 35, No. 5, Sep. 1999, pp. 2814–2819.

* cited by examiner

Primary Examiner—Julie Anne Watko
(74) Attorney, Agent, or Firm—Antonelli, Terry, Stout & Kraus, LLP

(57) ABSTRACT

A magnetoresistive sensor of the type of flowing a signal sensing current perpendicular to the plane to improve resolution at reproducing a signal, a magnetic head using the magnetoresistive sensor, and a magnetic disk apparatus. A magnetoresistive sensor comprising a substrate, a pair of magnetic shield layers consisting of a lower magnetic shield layer and an upper magnetic shield layer, a magnetoresistive sensor layer, disposed between the pair of magnetic shield layers, an electrode terminal for flowing a signal current perpendicular to the plane of the magnetoresistive sensor layer, and magnetic domain control layers for controlling Barkhausen noise of the magnetoresistive sensor layer, wherein the magnetic domain control layers disposed in contact with opposite ends of the magnetoresistive sensor layer consist of a material having high electric resistivity and with a specific resistance not less than 10 mΩcm so as to give the magnetoresistive sensor having excellent reproducing resolution.

6 Claims, 10 Drawing Sheets

MAGNETORESISTIVE SENSOR INCLUDING MAGNETIC DOMAIN CONTROL LAYERS HAVING HIGH ELECTRIC RESISTIVITY

BACKGROUND OF THE INVENTION

1. Field of the Invention

The present invention relates to a magnetoresistive sensor including magnetic domain control layers for the magnetoresistive sensor for reading back magnetically recorded information, a magnetic head, and a magnetic disk apparatus. More specifically, it relates to a magnetoresistive sensor having excellent reproducing resolution, a magnetic head using the same, and a magnetic disk apparatus.

2. Description of the Related Art

The recording density in a magnetic disk apparatus has been improved significantly, and the demand that the performance of the magnetic read/write heads thereof be enhanced is increased in regard to both characteristics of read and write.

Regarding the read head sensor, it is necessary to improve the techniques concerning three points: (1) improvement of a technique for making the efficiency higher, (2) improvement of a technique for making the track width smaller, and (3) a technique for making the gap between the write magnetic shields smaller.

With respect to (1), making the efficiency higher has been advanced by developing an MR head utilizing a magnetoresistive effect. At a low recording density of several giga bits per square inch (Gb/in2), anisotropic magnetoresistive effect (AMR) is used to convert the magnetic signal on recording media to an electric signal. At a high recording density exceeding this, a higher efficient giant magnetoresistive effect (GMR) is used to respond to this high recording density. However, when making the efficiency much higher is advanced, the structure must be changed to the perpendicular magnetic recording structure in relation to the read element, which makes the most of GMR (CPP-GMR) or a tunnel magnetoresistive effect (TMR) of a system for flowing a sensing current perpendicular to the plane.

As a known example of a magnetic head employing GMR, Japanese Patent Publication No. Hei 8(96)-21166 (Japanese Un-examined Patent Publication No. Hei 4(92)-358310) describes the structure called a spin valve. This comprises a pinned layer consisting of a magnetic material in which a anti-ferromagnetic layer pins magnetization in the specific direction, and a free layer consisting of a non-magnetic thin film laminated on the pinned layer and a magnetic layer laminated through the non-magnetic thin film, so as to change electric resistance at a relative angle of magnetization of the pinned layer and the free layer.

With respect to (2), the track width is made smaller to improve the track density. It is generally thought that the read track width is determined by the distance between electrodes flowing a sensing current for sensing changed resistance. The read sensor has a high loss of S/N when Barkhausen noise is caused, and it is necessary to control this. The Barkhausen noise is caused together with microscopic domain wall movement, and there must be arranged magnetic domain control layers so as to provide the read sensor singly in the form of a magnetic domain. The magnetic domain control layers are often arranged on opposite sides of the sensor layer portion of the read sensor, viewed from the media-opposed surface side. The magnetic domain control layer is generally a hard magnetic metal material layer formed on a suitable metal underlayer, and an insulating oxide layer is required for the contact surface of the same with the magnetoresistive sensor layer, the top surface of the lower shield, and the contact surface of the same with the upper shield. The magnetic domain control layer provides a magnetic field for the magnetoresistive sensor layer, so that the anisotropic magnetic field is increased effectively and the exterior magnetic efficiency is reduced greatly. For this reason, Japanese Un-examined Patent Publication No. Hei 9(97)-282618 describes the structure in which the gap between the electrodes is smaller, than that between the magnetic domain control layers, and a sensor region having an efficiency effective for the exterior magnetic field is used for sensing a signal.

With respect to (3) the technique for making the read gap smaller, that is, for making the gap between the read magnetic shields smaller, there has been studied improvement of linear recording density by modifying resolution. Generally, the shield layers are arranged at the upper and lower sides so as to interpose the magnetoresistive sensor layer, and a gap layer made of an insulating material is disposed between the shield layer and the magnetoresistive sensor layer so as to prevent a sensing current from being leaked to the shield. When the gap between the read magnetic shields is smaller, the thickness of the gap layer is reduced. Thus, the thickness dependence as the characteristic of the insulating layer or the presence of pinhole cannot maintain the insulating properties, so that an electric current for sensing a signal (sensing current) is leaked to the magnetic shield to reduce read output. This loss is called a shunting loss.

As a method of solving this, Japanese Un-examined Patent Publication No. Hei 5(93)-266437 describes the structure in which an insulating magnetic layer is arranged on the surface of the magnetoresistive sensor layer side of at least one of the magnetic shields.

The read element is difficult to provide a sufficient recording magnetic field in a conventional in-plane magnetic recording system. Further, CPP (Current Perpendicular to the Plane)—GMR or TMR as a high efficient magnetoresistive sensor is a magnetoresistive sensor utilizing a structure flowing a sensing current perpendicular to the plane. Thus, a future structure of the read element is thought to be of the CPP system employing a sensing current. However, employing such a structure, when the area of the magnetoresistive sensor layer is reduced, there arises a new problem that the conventional magnetic domain control layer is difficult to ensure the insulating properties of the magnetic domain control layer. In other words, the conventional magnetic domain control layer is arranged on the lower magnetic shield by employing a laminating structure of insulating layer/(metal underlayer)/hard magnetic metal material layer/insulating layer, and then is in contact with opposite ends of the magnetoresistive sensor layer. The magnetoresistive sensor layer is made thinner and finer; there are imposed three problems: (1) the throwing power of the lower insulating layer is insufficient so as to shunt the sensing current flowing to the magnetoresistive sensor layer to the magnetic domain control layer, resulting in reduction of output, (2) the thick lower insulating layer is adhered so as to increase the gap between the magnetoresistive sensor layer and the magnetic domain control layer, thereby making the magnetic domain control different from the design, and (3) in consideration of the thickness maintaining the pressure resistance of the insulating layer, the magnetic layer thickness of the magnetic domain control layer is reduced relatively, so as not to ensure a predetermined susceptibility, thereby making it difficult to design the magnetic domain control. Further, when employing the yoke structure or the flux guide structure of the TMR element, these must be magnetic domain controlled. Simply, there is employed means for laminating a plurality of the above-mentioned magnetic domain control layer. This will involve a very difficult problem in process.

SUMMARY OF THE INVENTION

An object of the present invention is to provide a magnetoresistive sensor having, in particular, excellent reproducing resolution, in magnetic read and write, a magnetic head using the same, and a magnetic disk apparatus, and, for that, to provide magnetic domain control layers having high electric resistivity suitable for improving the reproducing resolution of the magnetoresistive sensor.

In order to achieve the foregoing objects, the present invention solves the above-mentioned problems with respect to the magnetic domain control layer by the following means, and provides a magnetoresistive sensor having excellent reproducing resolution, a magnetic head using the same, and a magnetic disk apparatus.

Conventionally, the magnetic domain control layer is arranged on the lower magnetic shield by employing a multi-layered structure of insulating layer/(metal underlayer)/hard magnetic metal material layer/insulating layer. In the present invention, there is used means wherein the magnetic domain control layer comprises a single layer made of a hard magnetic material having high electric resistivity, thereby directly performing magnetic domain control. According to this method, the insulating layers arranged at the upper and lower sides of the magnetic layer can be omitted. Thus, when the magnetoresistive sensor layer is made thinner, a loss of the susceptibility due to the thickness of the insulating layer can be reduced, so as to lower the shunting loss of an electric current. In addition, since the magnetic domain control layer is in direct contact with the magnetoresistive sensor layer, the loss of the magnetic field of the magnetic domain control can be minimized.

As a hard magnetic material having high electric resistivity with such characteristics, there are (1) a magnetic oxide having a spinel lattice, and (2) a granular magnetic material made of a hard magnetic metal material and a non-magnetic insulating material. With respect to (1), there is γ-Fe2O3 or the like. When a γ-Fe2O3 (004) layer grows, the residual magnetization is relatively large, the coercivity is high, and the specific resistance is high and $10^5$ to $10^6$ Ωcm. Thus, this is adaptable to the above-mentioned single magnetic domain control layer. As for such a system, there is also γ-(FeCo)2O4.

However, in order to exhibit the magnetic characteristic by making the spinel lattice thinner, it is generally necessary to manufacture the layer at a very high substrate temperature (above 500° C.). When the layer is manufactured in a practical temperature range below 300° C. using a sputtering method, it tends to be an amorphous layer. As means of solving this, there is envisaged a method of inserting one high orientation thin oxide film or one single crystal thin film, with an NaCl structure, under the spinel lattice magnetic layer, so as to form thereon the above-mentioned magnetic domain control layer having high electric resistivity, and this is used as means.

Examples of the underlayer material for use in this method include CoO (200), MgO (200), NiO (200), EuO (200), FeO (200) and ZnO (001). These materials can be relatively easily grown at room temperature by means of the sputtering method. When a spinel type compound γ-Fe2O3 is grown on this plane, it is found that the γ-Fe2O3 (400) plane can be manufactured on these oxides in a relatively low temperature range below 300° C. These thin oxide films can exhibit a function as the underlayer even in the thickness range of 1 nm to 5 nm. These underlayers are electrically an insulator to insulating semiconductor. Basically, they can eliminate shunting from the magnetoresistive sensor layer to the magnetic domain control layer.

In the granular magnetic material made of a hard magnetic metal material and a non-magnetic insulating material, the multi-layer laminated is formed using the mixed sputtering method or the sputtering method, so that a hard magnetic material in granular form is formed in the non-magnetic insulating material. At this time, when the granular volume is smaller than the critical volume (granular volume V in which thermal energy kT is larger than magnetic energy MV+KV), the material becomes magnetically paramagnetic, or weak soft magnetic. However, when the granular particle is larger than the critical volume and the granular shape is changed anisotropically for pinning by the insulator, it can become magnetically hard. The granular magnetic material of the present invention is a material in which the hard magnetic metal material is enclosed by the non-magnetic insulating material, and the granular volume is larger than the critical volume. When the above-mentioned conditions are met, the granular shape is optional.

DETAILED DESCRIPTION OF THE PREFERRED EMBODIMENTS

Embodiments of the present invention will be described based on the examples with reference to the drawings.

Example 1

Figure 1:
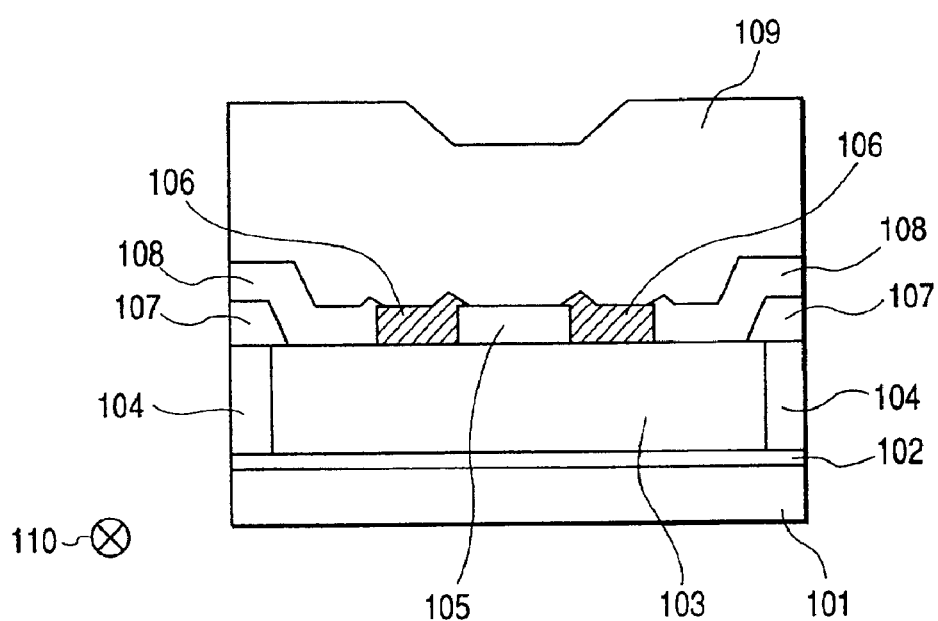
FIG. 1 is a diagram showing the sectional structure of the media-opposed surface side of the magnetoresistive sensor of Example 1 of the present invention and the position of a magnetic domain control layer.
Figure 2:
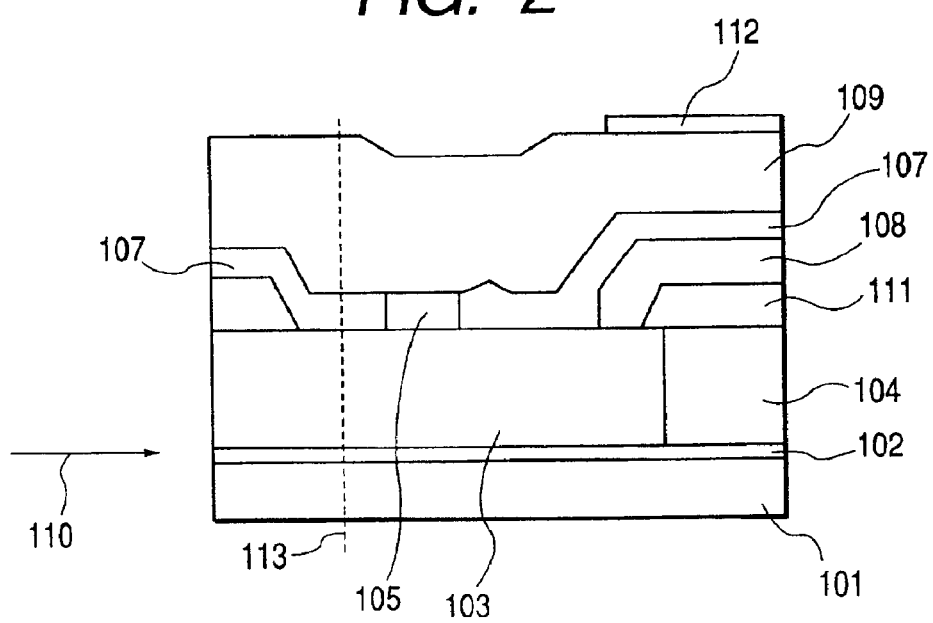
FIG. 2 is a cross-sectional view of the depth direction of the magnetoresistive sensor of Example 1 of the present invention.

FIGS. 1 and 2 are diagrams showing the structure of a magnetoresistive sensor as one embodiment according to the present invention viewed from the media-opposed surface and section of the plane perpendicular to the depth direction, respectively. Arrow 110 in the drawing denotes the depth direction.

On a substrate 101 is formed a base insulating layer 102, made of, for example, alumina. After subjected to precision polishing by means of chemimechanical polishing (CMP), a lower magnetic shield layer 103 is formed thereon. This is made of Ni81Fe19 having a thickness of 2 μm manufactured by, for example, the sputtering method, the ion beam sputtering method, or the plating method. A resist mask is patterned in a predetermined size in this layer, and other portions thereof are subjected to ion milling to strip off the resist. Al2O3 is grown thereon to fill in portions 104 removed by ion milling. After this is subjected to CMP, an electrode layer made of Cu or Ru (not shown) is grown by 20 nm, so as to form a drawing electrode layer 111 in a portion away from the sensor portion. This is, for example, a layer made of Ta, Au and Ta.

A lift-off pattern is formed in a region on the previous electrode layer consisting of a magnetoresistive sensor layer, so as to form thereon a layer having a thickness of 150 nm made of a mixture of Al2O3 and SiO2. This may be a single phase layer made of Al2O3 or SiO2. After lifting this off, a magnetoresistive sensor layer 105 is formed, and a layer 108 (e.g., FIG. 2) is formed on top of electrode layer 111. In the magnetoresistive sensor layer, there are studied as the examples two types of using GMR and of using TMR. An electric current for sensing a signal (sensing current) is flowed perpendicular to the plane of these magnetoresistive sensor layers (Current Perpendicular to the Plane: CPP).

A GMR layer comprises, for example, from the lower side, a Co48Mn52 anti-ferromagnetic layer of 12 nm, a pinned layer consisting of Co of 1 nm, Ru of 0.8 nm and Co of 2 nm, a free layer consisting of Cu of 2 nm, Co of 0.5 nm and Ni81Fe19 of 2.5 nm, and Ta of 3 nm. With respect to the anti-ferromagnetic layer, in the case of using a regular anti-ferromagnetic layer of a PtMn system, anneal is required in order to exhibit the exchange bonding between the pinned layer and the anti-ferromagnetic layer. The magnetic field of the pinned layer is directed in the in-plane direction orthogonal to the depth.

On the other hand, a TMR layer comprises, for example, from the lower side, a free layer consisting of Ta of 5 nm, NiFe of 3 nm and a CoFe layer of 2 nm, a barrier layer consisting of Al2O3 of 2 nm, a pinned layer consisting of CoFe of 2 nm, Ru of 1 nm and CoFe of 1 nm, a anti-ferromagnetic layer consisting of MnIr of 10 nm, Ta of 3 nm, and NiFe of 5 nm.

After forming the magnetoresistive sensor layer 105, a lift-off material is formed in the position as an active region (on the layer served both as the lower shield and electrode). Then, the magnetoresistive sensor layer is etched, for example, by the ion milling method. After etching, magnetic domain control layers 106 are formed so as to remove the lift-off mask. Thereafter, a pattern in the depth direction of the magnetoresistive sensor layer 105 is formed in the magnetic domain control layers 106, and then, the portion therearound is removed by the ion milling. A mixed layer of Al2O3 and SiO2 having a thickness of 150 nm is formed thereon as a protective insulating layer 107 to define an upper shield layer 112.

A write element having a magnetic core laminated through a recording gap is formed on the magnetoresistive sensor to define a magnetic head of the magnetic disk apparatus.

By means of a method represented by the above-mentioned manufacture method, the magnetoresistive sensor of the present invention and the magnetic head using the same are manufactured. In this, the magnetic domain control layer 106 has a required characteristic different from the case of flowing an electric current in the plane. In the magnetic domain control layer, there have been studied the magnetic domain control layer itself is: (1) a layer made by laminating, from the lower portion, an insulating layer Al2O3-SiO2 layer of 220 nm, a Cr underlayer of 5 nm, a magnetic layer CoCrPt of 25 nm, and an insulating protective Al2O3-SiO2 layer of 220 nm on the top, (2) a layer made by laminating, as the magnetic layer, a CoO underlayer of 5 nm, and a γ-Fe2O3 layer of 50 nm, (3) a layer made by laminating, as the magnetic layer, a γ-Fe2O3 layer of 50 nm, and (4) a layer by alternately laminating CoCrPt of 1.5 nm and SiO2 of 1.1 nm (60 nm thick).

Figure 5:
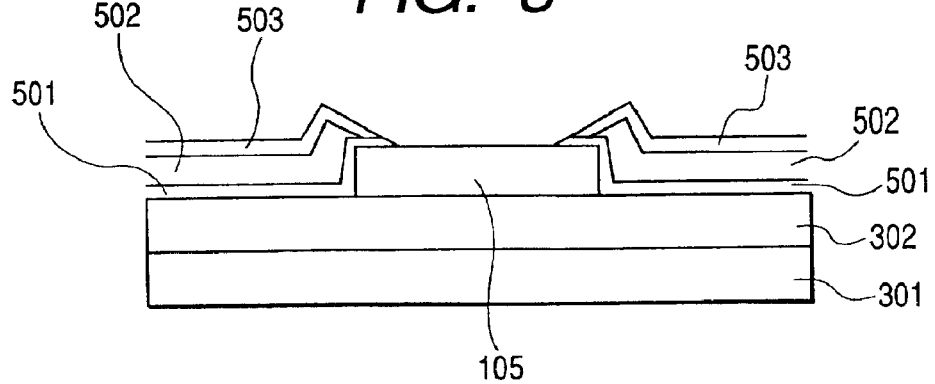
FIG. 5 is a cross-sectional view of the media-opposed surface side of Example 1 (1) of the present invention showing the position relation between the magnetic domain control layer having high electric resistivity and the magnetoresistive sensor layer.

In the method (1), there is shown a conventional magnetic domain control layer as shown in the schematic structure of FIG. 5, as a comparative example. When the conventional magnetic domain control layer is applied as-is, the gap between the shields Gs not less than 70 nm makes it possible to manufacture magnetic domain control layers 501, 502 and 503. However, the following points in formation of the junction of the ends of the magnetoresistive sensor layer are important in order to maintain insulation of the CoCrPt (502) from the lower portion Al2O3 (501).

One of the points is that, in order to maintain insulation, the ends of the magnetoresistive sensor layer 105 must be completely coated by the Al2O3 layer 501, the hard metal magnetic CoCrPt (502) must be grown thereon, and the Al2O3 layer 503 grown thereon must completely coat the CoCrPt layer. For this reason, the sputtering apparatus forming the layer needs to have a characteristic such that the Al2O3 is inserted into the lift-off pattern in the plane, and CoCrPt is not inserted deeply therein, and to ensure such manufacture conditions. Further, for manufacture, the lift-off pattern must be formed, and when the size of the sensor is reduced (not more than 1 μm), the formation thereof is difficult. The insulating layer having a thickness less than 20 nm cannot have sufficient insulation properties, and when the layer is thick in order to maintain the sufficient insulation properties, the gap between the end of the magnetoresistive sensor layer 105 and the CoCrPt layer as the magnetic domain control layer is larger, so that the magnetic domain control force is weak, thereby making magnetic domain control impossible. For this reason, when the gap between the shields is not more than 70 nm in order to make the resolution of the read head high, the method (1) is difficult to use.

Figure 4:
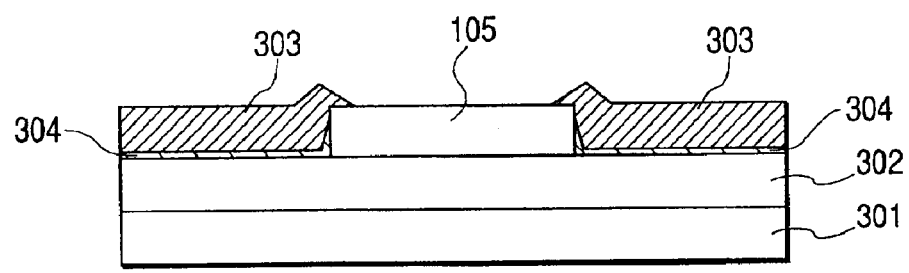
FIG. 4 is a cross-sectional view of the media-opposed surface side of Example 1 (2) of the present invention showing the position relation between the magnetic domain control layer having high electric resistivity and the magnetoresistive sensor layer.

The method (2) is one embodiment of the present invention shown in FIG. 4. First, a lower shield 302 is formed on an appropriately treated substrate 301, and the region in contact with opposite ends of the magnetoresistive sensor layer 105 thereon is formed with a CoO underlayers 304. CoO (002) is grown in the CoO underlayer, and γ-Fe2O3 (65 nm) is formed thereon, so as to manufacture a magnetic domain control layer 303. γ-Fe2O3 has a (004) orientation plane by the effect of the underlayer. This is the same for Co-γ-Fe2O3 as other ferrite.

This layer has a specific resistance not less than several 10 Ωcm in the layer state. In this case, the layer requires no lift-off pattern, and can be manufactured by the usual resist pattern. The magnetoresistive sensor layer may be in contact with the magnetic domain control layer, or the magnetic domain control layer may be lifted on the magnetoresistive sensor layer. According to this method, the magnetic domain control layer has electric resistivity much higher than the magnetoresistive sensor layer. A signal sensing current flows only through the magnetoresistive sensor layer, so as to eliminate a loss of the signal intensity due to shunting to the magnetic domain control layer.

Even when the gap between the shields is smaller, the insulating protective layer of conventional type is unnecessary. According to this, it is possible to reduce the total thickness of the magnetic domain control layer causing an equivalent susceptibility. The susceptibility is an amount to determine the thickness of the magnetic domain control layer by multiplying the magnetization of the free layer of the magnetoresistive sensor layer by the thickness thereof. In the case of the magnetic domain control layer, multiplication of the residual magnetization by the thickness is equivalent to this. γ-Fe2O3 or Co-γ-Fe2O3 in this study has a high specific resistance of $10^5$ to $10^6$ Ωcm, a coercivity of about 1.3 to 5.0 kOe, a residual magnetization of 1.2 to 3.5 kG, and a saturated magnetization of 3.5 to 4.2 kG. These values are smaller than those of CoCrPt (having a coercivity of about 1.0 to 3.0 kOe, a residual magnetization of 4 to 9 kG, and a saturated magnetization of 6.5 to 12.0 kG). In consideration of the protective insulating layer, it is effective for the magnetic domain control when the gap between the shields is small. As the layer formation process, the conventional four layers (Al2O3/Cr/CoCrPt/Al2O3) can be reduced to two layers, so as to make the operation efficient.

Figure 3:
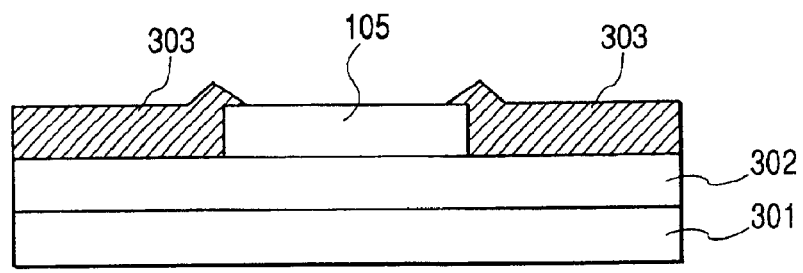
FIG. 3 is a cross-sectional view of the media-opposed surface side of Example 1 (3) of the present invention showing the position relation between the magnetic domain control layer having high electric resistivity and the magnetoresistive sensor layer.

In the method (3) as another example of the present invention, FIG. 3 shows a basic construction. This is the same as the method (2) except that the oxide underlayer 304 of the magnetic domain control layer is absent. In view of the manufacture method, the point of directly forming γ-Fe2O3 is different. In this case, the substrate temperature is raised to 300 to 500° C., and then, the layer is formed by the high vacuum layer forming apparatus having a maximum degree of vacuum of $10^{-11}$ Torr, or the top surface of the lower shield exposed is irradiated with an oxygen ion using an ECR ion source to oxidize the surface, so that γ-Fe2O3 can be precedably grown. In this case, the same effect as in the method (2) is found to be given.

Figure 6:
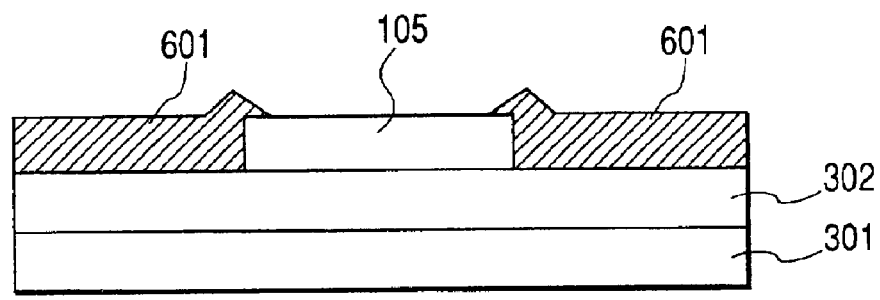
FIG. 6 is a cross-sectional view of the media-opposed surface side of Example 1 (4) of the present invention showing the position relation between the magnetic domain control layer having high electric resistivity and the magnetoresistive sensor layer.

The method (4) as another example of the present invention has the structure of FIG. 6. A magnetic domain control layer 601 in this case is a layer by alternately laminating CoCrPt of 1.5 nm and SiO2 of 1.1 nm. The thickness ratio of CoCrPt/SiO2 is between 2:1 and 1:2, CoCrPt has a layer thickness of 0.5 to 2 nm, a specific resistance not less than 10 mΩcm, a coercivity not more than about 1.0 kOe, and a residual magnetization of 2 to 4 kG, so as to give the same effect as described above. However, in this case, it is more effective that Al2O3 not less than 10 nm is inserted for the underlayer.

In the methods (2) to (4) of this example, even when the gap between the read shields (gap distance) is not more than 70 nm, the read characteristic is not found to be deteriorated due to the conduction of the magnetoresistive sensor layer and the magnetic domain control layer.

Example 2

The magnetoresistive sensor in Example (1) described above has the structure by lamination from the lower portion. The structure in which the upper and lower portions are reversed can also give the same effect.

Example 3

In Example (1) described above, in formation of the magnetic domain control layer using a spinel type oxide such as γ-Fe2O3, on the underlayer 304 of the magnetic domain control layer 303, is formed, in place of the CoO layer, an oxide layer having a crystal structure of NaCl type such as Mg (200), NiO (200), EuO (200), FeO (200) or ZnO (200) as well as a (200) plane. Then, the spinel ferrite formed thereon can be crystallized at low temperature. As a method of forming this layer, there is a method of manufacturing these layers by the sputtering method, the ion beam sputtering method or the cluster ion beam method. As a method other than this, on the lower shied 302 a layer of Co, Mg, Ni, Eu, Fe or Zn is formed in a thickness of 1–5 nm. This layer is exposed to oxygen in vacuum, is irradiated with oxygen using ECR plasma, or is exposed to low-pressure oxygen by heating the substrate (100 to 250° C.) so as to form an oxide layer, thereby forming a spinel ferrite thereon. This method can give equivalent results.

As a spinel type oxide formed on the oxide underlayer 304, there are $\gamma$-Fe2O3 and Co-$\gamma$-Fe2O3. The latter is thought to be a solid solution of $\gamma$-Fe2O3 and CoFe2O3, and is represented by the chemical formula (Co(y)Fe(8-2y)/3)O4($\gamma$-Fe2O3). The ratio of Co is varied to change the coercivity. As compared with the case that these are formed on a glass substrate, a high coercivity increased 1.5 to 2 times is exhibited in the same thickness as that of these formed on the oxide underlayer, and when the Co/Fe ratio is 0.08, a coercivity of 2.6 kOe in 10 nm.

Example 4

Figure 7:
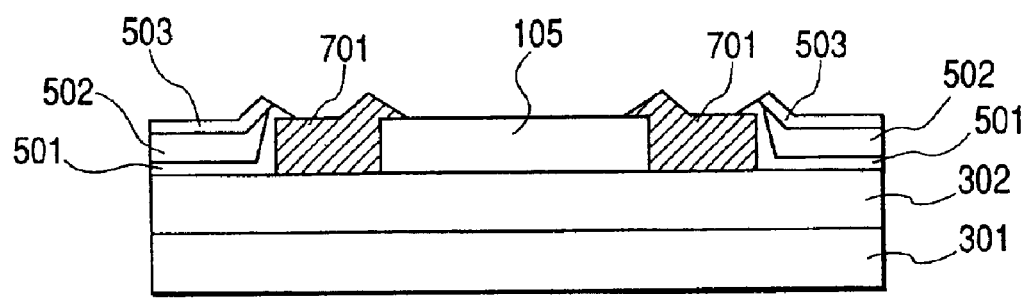
FIG. 7 is a cross-sectional view of the media-opposed surface side of Example 4 of the present invention showing the position relation between the magnetic domain control layer having high electric resistivity and the magnetoresistive sensor layer.

Before forming the magnetic domain control layer of Example 1 (1), as shown in FIG. 7, portions 701 are formed with MnZn ferrite as a soft magnetic layer having high electric resistivity, an insulator and a metal magnetic material are alternately laminated, or there is formed a granular layer in which these are sputtered at the same time into a mixed state, for example, a layer by laminating, by 25 number of layers, Co90Fe10 layers having a thickness of 1.4 nm and Al2O3 layers having a thickness of 1.0 nm. Thereafter, the outside of the layer is removed by the ion milling in the position several mm away from the outer peripheral portion of the magnetoresistive sensor layer, and then metal magnetic layers such as CoCrPt as represented by 502 are formed in the removed portions. This structure has no shunting since the metal magnetic domain control layers 502 are not in direct contact with the magnetoresistive sensor layer. However, since a layer with soft magnetic properties is disposed therebetween, the magnetic field of the magnetic domain control is effectively applied to the magnetoresistive sensor layer.

Example 5

Figure 10:
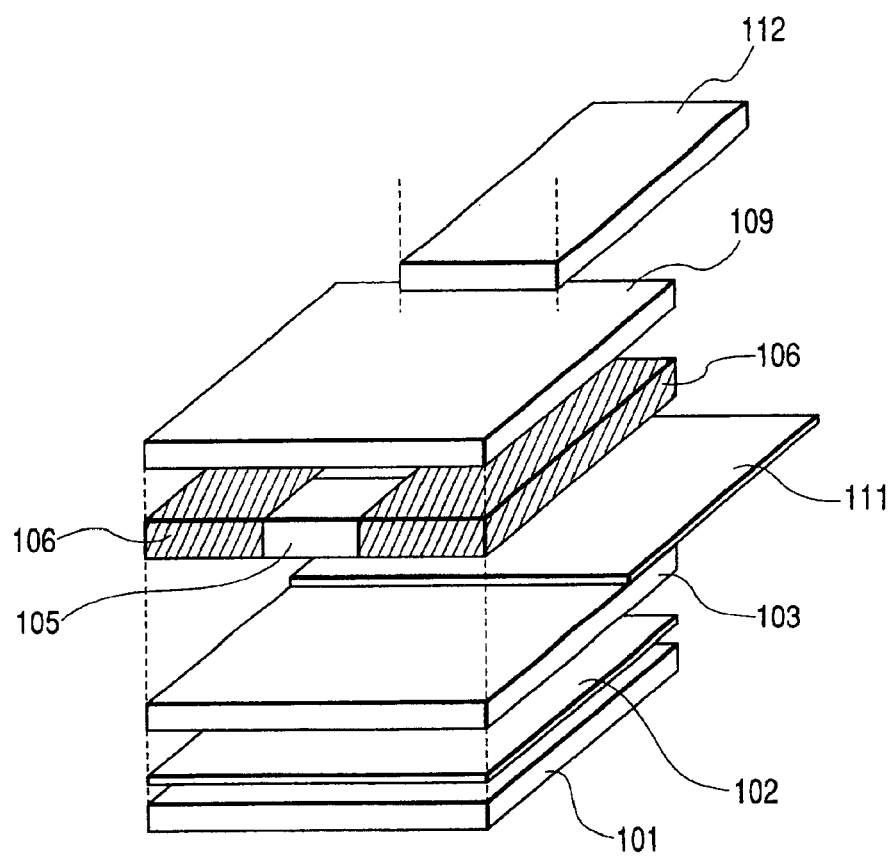
FIG. 10 is a three-dimensional block diagram showing the structure of the exposed type magnetoresistive sensor of Examples 1 and 5 of the present invention.
Figure 11:
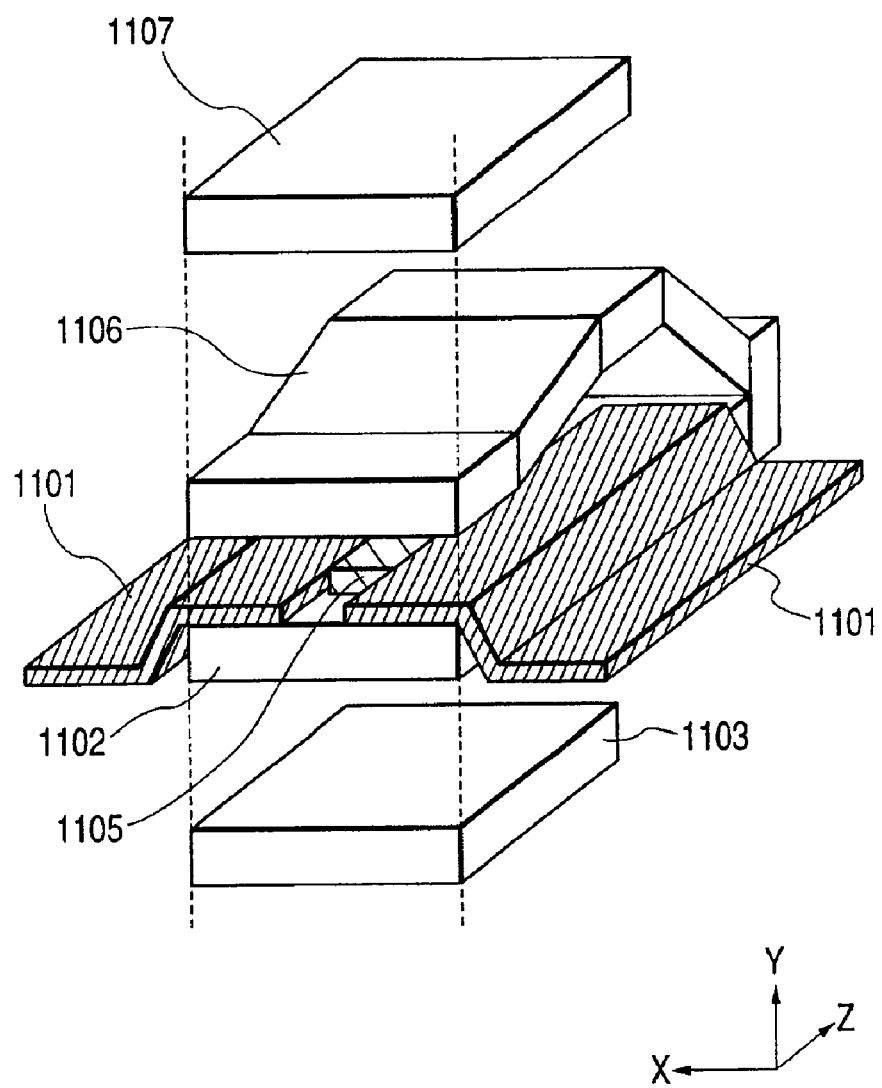
FIG. 11 is a block diagram schematically showing one example of the yoke structure shown in Example 5 of the present invention and the position of the magnetic domain control layers of the present invention to magnetic domain-control this.
Figure 12:
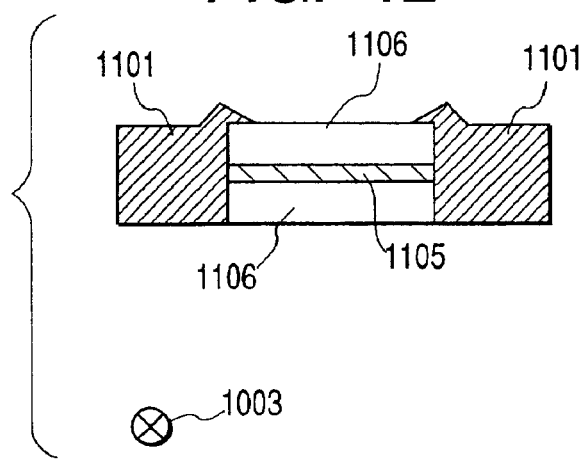
FIG. 12 is one example of the position of the magnetic domain control layers of the yoke structure shown in Example 5 of the present invention.
Figure 13:
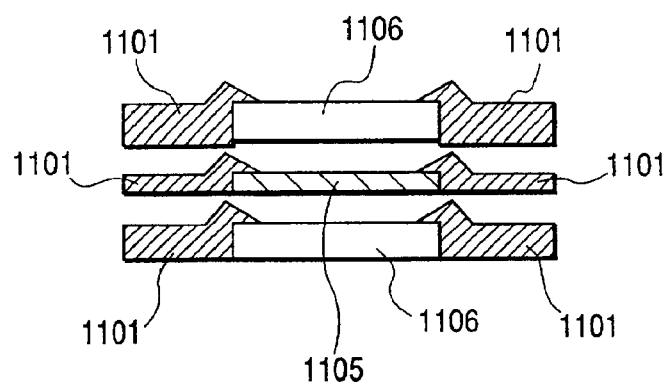
FIG. 13 is one example of the position of the magnetic domain control layers of the yoke structure shown in Example 5 of the present invention.

In the magnetoresistive sensor with the magnetoresistive sensor layer is exposed, according to a three-dimensional schematic diagram exploding the structure of the magnetoresistive sensor, as shown in FIG. 10, the magnetic domain control layers 106 are arranged on opposite ends of the magnetoresistive sensor layer 105, and the magnetic shields 103 and 109 are disposed at the upper and lower sides thereof. In the present invention described in the above examples, the layer 106 is a material having high electric resistivity. There is a magnetoresistive sensor of another structure, that is, a magnetoresistive sensor provided with a yoke structure as the write sensor. FIG. 11 is a three-dimensional diagram schematically showing a representative yoke structure and the magnetic domain control layer. In this structure, a magnetoresistive sensor layer 1105 is not exposed from the surface opposite the media. In the gap between a lower magnetic shield 1103 and an upper magnetic shield 1107, made of Ni81Fe19, are arranged yoke layers made of a similar soft magnetic material. The properties of this structure described below are observed. In FIG. 11, the yoke layers in C ring form consist of an upper yoke 1106 joined to a lower yoke 1102. Other than this, the lower yoke is reduced on the end thereof, or has a thick film, or the yoke is discontinuous under the magnetoresistive sensor layer. In the diagram, a magnetic domain control layer 1101 is shown. The magnetic domain control layer having high electric resistivity shown in Example 1 of the present invention is used as the layer. This magnetic domain-controls at least the lower yoke and the magnetoresistive sensor layer and has no shunting in the periphery. The magnetic domain control layer has a type for magnetic domain-controlling the upper and lower yoke layers and the magnetoresistive sensor layer at the same time, and a type for magnetic domain-controlling each. In either structure, it is found that the good magnetic domain control is possible without shunting.

Figure 8:
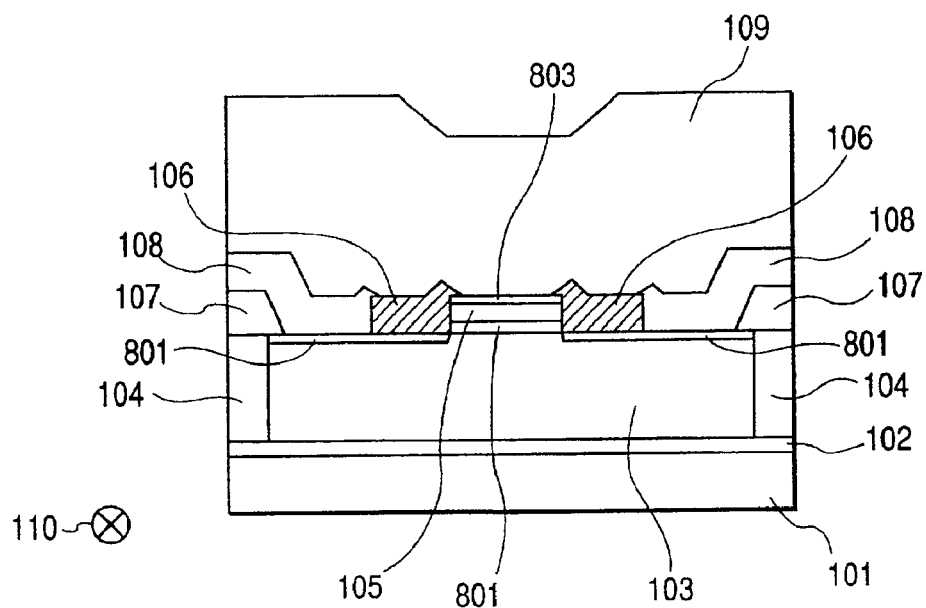
FIG. 8 is a diagram showing the sectional structure of the media-opposed surface side of the magnetoresistive sensor of Example 5 of the present invention and the position of the magnetic domain control layer.
Figure 9:
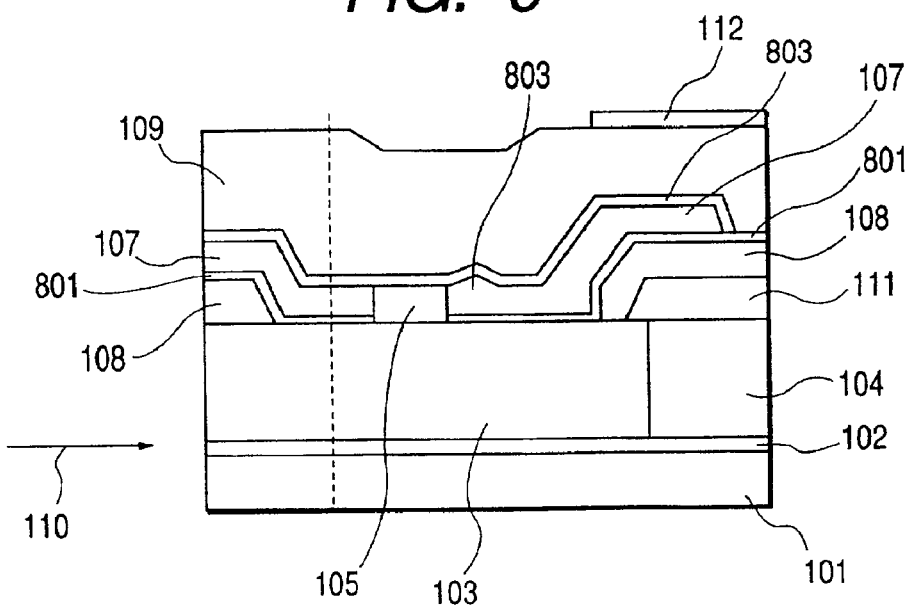
FIG. 9 is a cross-sectional view of the depth direction of the magnetoresistive sensor of Example 5 of the present invention.

The above-mentioned FIG. 11 is a block diagram for simply showing the position of the magnetic domain control layer in the yoke structure. In detail, the magnetic domain control layer is manufactured in a structure of the magnetoresistive sensor layer as one example of the present invention viewed from the media-opposed surface and a structure represented by the diagram showing a section of the depth direction, as shown in FIGS. 8 and 9.

Figure 14:
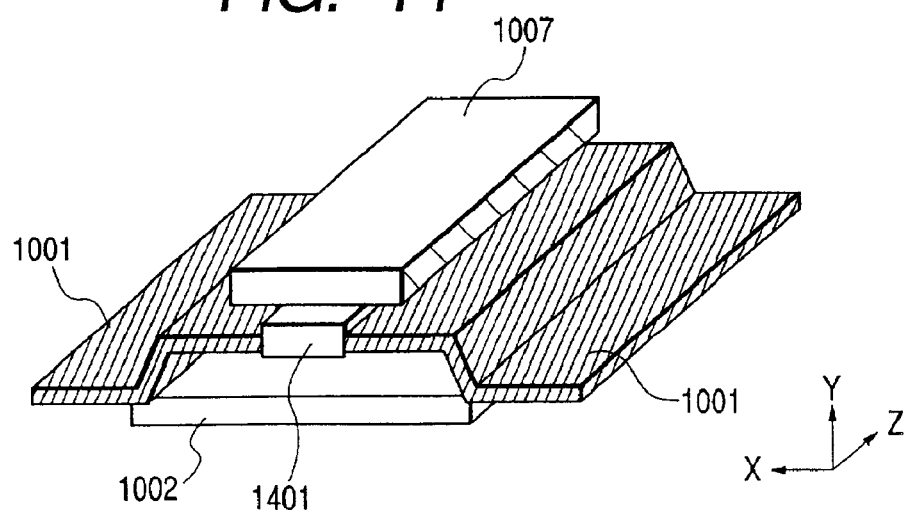
FIG. 14 is a block diagram schematically showing one example of the flux guide type yoke structure shown in Example 5 of the present invention and one example of the position of the magnetic domain control layers of the present invention to magnetic domain-control this.

FIG. 14 shows a schematic diagram of the flux guide type yoke structure and the magnetic domain control thereof. The surface viewed from the XY side in the diagram is the media-opposed surface. On the magnetoresistive sensor layer disposed on the lower shield 1002 so as to be recessed, is formed a soft magnetic layer made of, for example, Ni89Fe19, as indicated by 1401, having a shape, which extends from the position exposed from the media-opposed surface onto the magnetoresistive sensor layer, is in contact with the surface opposite the media-opposed surface of the magnetoresistive sensor layer, and extends to a depth direction Z. This layer guides the magnetic flux from the recording media to the magnetoresistive sensor layer, and is called a flux guide. In order to magnetic domain-control this flux guide layer, in the process of forming the magnetoresistive sensor layer, ion milling, patterning, forming the flux guide layer 1401, and forming the magnetic domain control layer 1001, the magnetic domain control material having high electric resistivity of the present invention is used as the magnetic domain control layer 1001 to give the following advantages. Conventionally, the insulating protective layer must be formed in the track width direction of the magnetoresistive sensor layer. In the present invention, even when the magnetic domain control layer is formed directly, magnetic domain control is possible without shunting. In the flux guide type yoke structure, it is also possible to magnetic domain-control the magnetoresistive sensor layer together with the flux guide type yoke.

Figure 15:
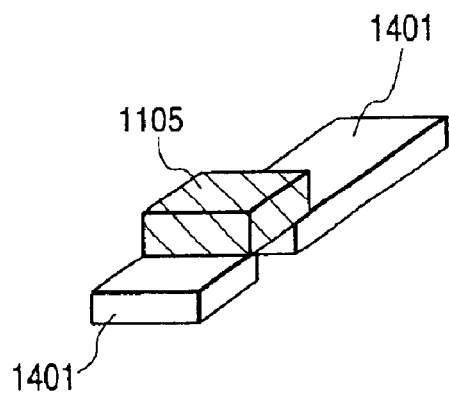
FIG. 15 is a diagram showing one example of the shape of the flux guide type yoke of Example 5 of the present invention, and one example of the position relation between the same and the magnetoresistive sensor.
Figure 16:
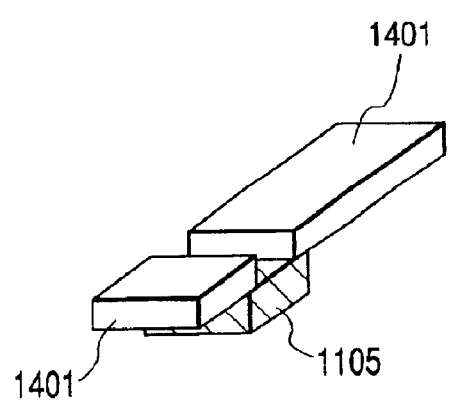
FIG. 16 is a diagram showing one example of the shape of the flux guide type yoke of Example 5 of the present invention, and one example of the position relation between the same and the magnetoresistive sensor layer.
Figure 17:
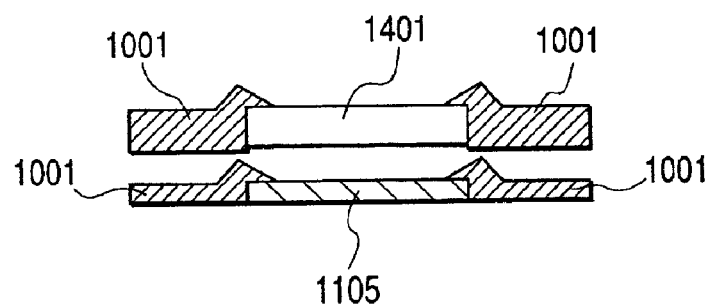
FIG. 17 is one example of the position of the magnetic domain control layers of the yoke structure shown in Example 5 of the present invention.
Figure 18:
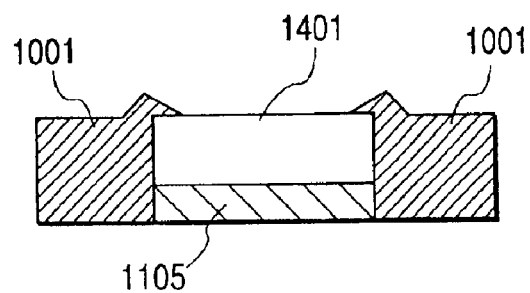
FIG. 18 is one example of the position of the magnetic domain control layers of the yoke structure shown in Example 5 of the present invention.

As shown in FIGS. 15 and 16, in order to increase an amount of the magnetic flux sensed by the magnetoresistive sensor layer, the portion in contact with the magnetoresistive sensor layer of the yoke is discontinuous. In such a structure, the material of the magnetic domain control layer is a layer having high electric resistivity so as to form the magnetic domain control layer of the present invention. Examples of arrangement of the magnetic domain control layer of the yoke structure of this embodiment are shown in FIGS. 17 and 18.

Example 6

Figure 19:
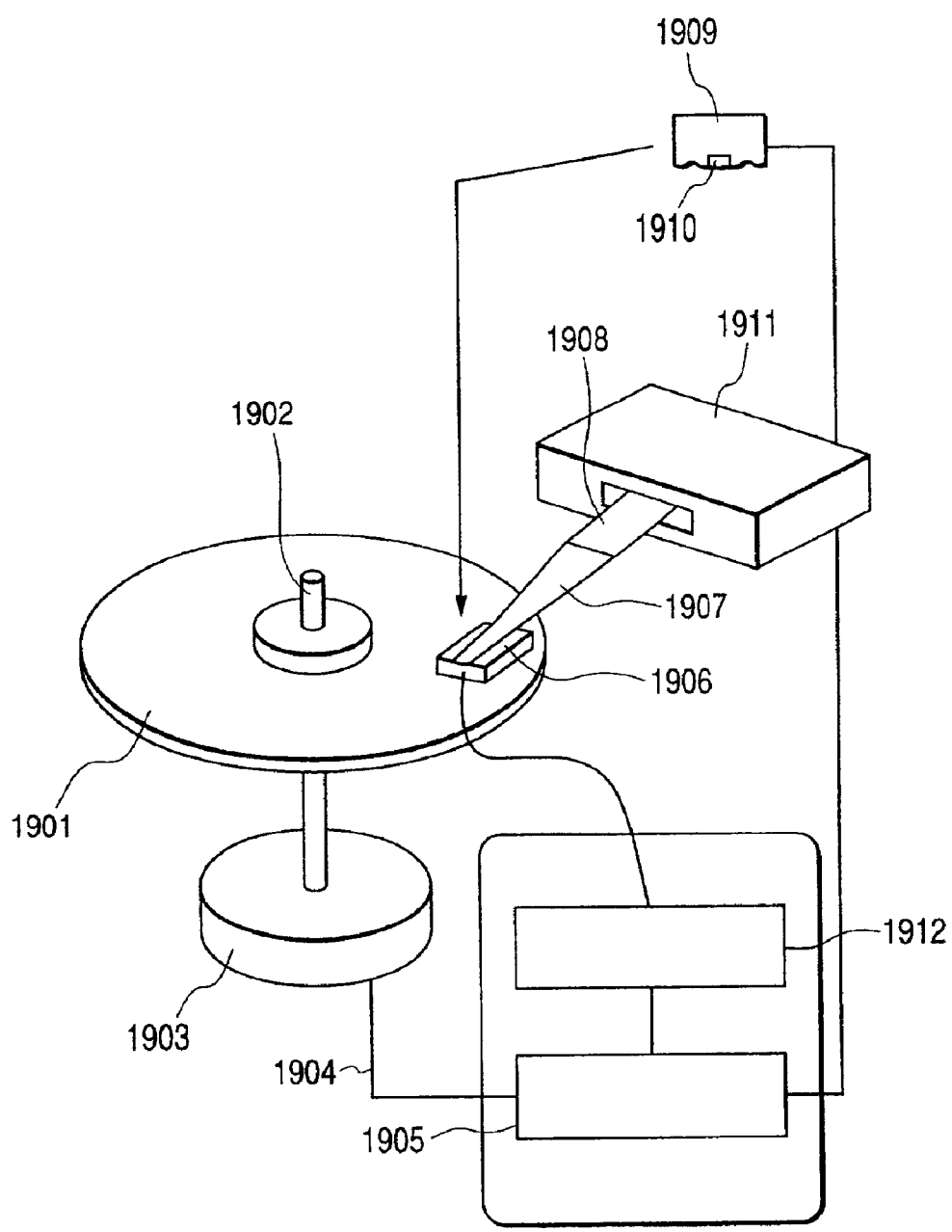
FIG. 19 is a schematic diagram of the structure and operation of a magnetic disk apparatus of Example 6 of the present invention.

FIG. 19 is a diagram showing the magnetic disk apparatus of one embodiment using the magnetic head mounting the magnetoresistive sensor according to the present invention.

The magnetic disk apparatus illustrated comprises a magnetic disk 1901 as a magnetic recording media formed in disk form for recording data in a recording region called a concentric track and a magnetic transducer, a magnetic head 1906 comprising a magnetic transducer, reading and writing the data and mounting the magnetoresistive sensor according to the present invention (in detail, comprising a magnetic head 1910 and a slider 1909), actuator means 1911 for supporting the magnetic head 1906 to move it to a predetermined position on the magnetic disk 1901, and control means for controlling transmission and receive of data by read and written by the magnetic head and movement of the actuator means.

The structure and operation will be described below. At least one rotatable magnetic disk 1901 is supported by a rotation axis 1902, and is rotated by the drive motor 1903. At least one slider 1909 is placed on the magnetic disk 1901, one or more sliders 1909 are disposed, and support the magnetic head 1910 according to the present invention for read and write.

The magnetic disk 1901 is rotated, and at the same time, the magnetic head 1906 is moved on the disk surface for access to a predetermined position in which data to be desired are recorded. The magnetic head 1906 is provided on an arm 1908 by a gimbal 1907. The gimbal 1907 has slight elasticity and brings the magnetic head 1906 into contact with the magnetic disk 1901. The arm 1908 is mounted on the actuator 1911.

There is a voice coil motor (hereinafter referred to as VCM) as the actuator 1911. VCM consists of a movable coil placed in the magnetic field fixed, and the movement direction and movement speed of the coil are controlled by an electric signal given from the control means 1912 through a line 1904. The actuator means of this embodiment comprises, for example, the magnetic head 1906, the gimbal 1907, the arm 1908, the actuator 1911 and the line 1904.

During operation of the magnetic disk, the magnetic disk 1101 is rotated to cause air bearing due to air flow between the magnetic head 1906 and the disk surface, which lifts the magnetic head 1906 from the surface of the magnetic disk 1901. During operation of the magnetic disk apparatus, the air bearing is balanced with the slight elasticity of the gimbal 1907, the magnetic head 1906 is not in contact with the magnetic disk surface, and is maintained so as to be lifted from the magnetic disk 1901 at a constant interval.

The control means 1912 generally comprises a logic circuit, memory, and microprocessor. The control means 1912 transmits and receives a control signal through each line, and controls various structure means of the magnetic disk apparatus. For example, the motor 1903 is controlled by a motor driven signal transmitted through the line 1904.

The actuator 1911 is controlled so as to optimally move and position, by means of a head position control signal and a seek control signal through the line 1904, the magnetic head 1906 selected to a data track to be desired on the magnetic disk 1901 associated therewith.

The magnetic head 1910 reads data on the magnetic disk 1901 so as to convert the data to an electric signal. The control signal receives and decodes the electric signal through the line 1904. In addition, an electric signal written as data to the magnetic disk 1901 is transmitted through the line 1904 to the magnetic head 1910. In other words, the control means 1912 controls transmission and receive of information read or written by the magnetic head 1910.

The read and write signals described above permit means directly transmitted from the magnetic head 1910. There are, for example, an access control signal and a clock signal as the control signal. The magnetic disk apparatus may have a plurality of magnetic disks and actuators, and the actuator may have a plurality of magnetic heads.

Such plurality of mechanisms are provided, so as to form the so-called disk array apparatus.

In this apparatus, the magnetoresistive sensor of the present invention is used as the magnetoresistive sensor of the magnetic head. It is thus possible to improve reproducing resolution of the apparatus according to improved performance of the magnetoresistive sensor.

Example 7

Figure 20:
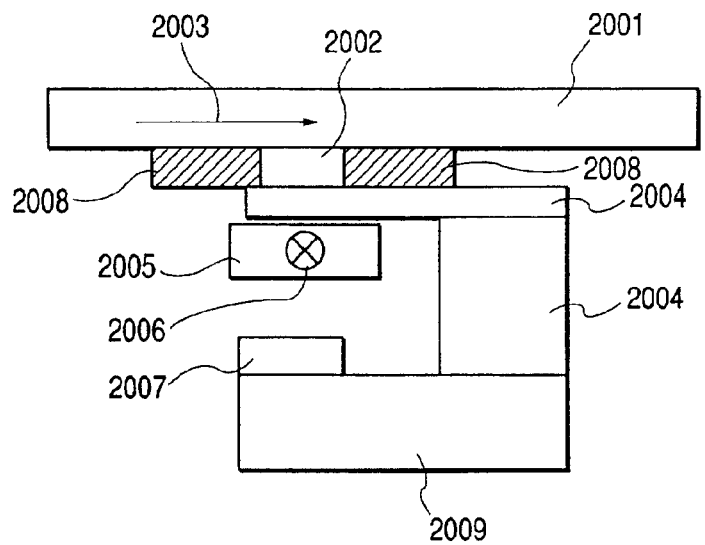
FIG. 20 is a side view of one example of the structure of MRAM using the magnetoresistive sensor layer provided with the magnetic domain control layers having high electric resistivity of the present invention.
Figure 21:
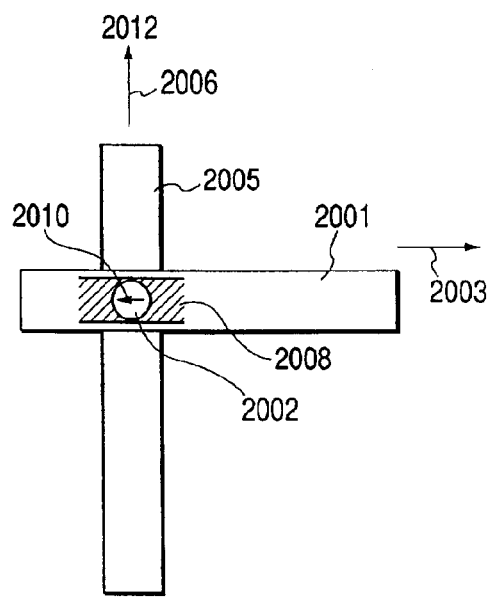
FIG. 21 is a diagram of FIG. 20 viewed perpendicular to the substrate surface (representing state "1")
Figure 22:
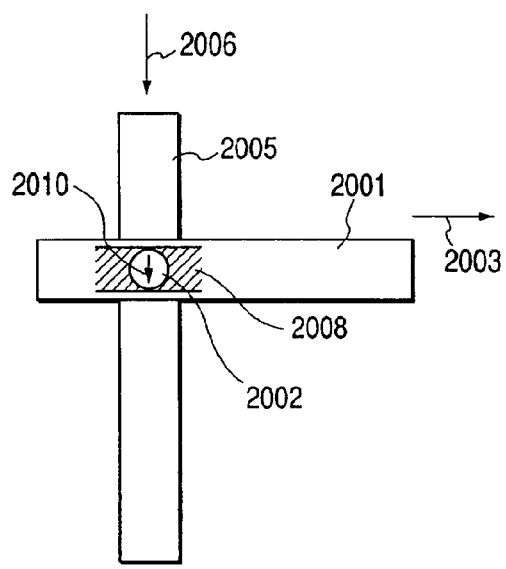
FIG. 22 is a diagram in which the direction of an electric current flowing through the conductive line is shifted 90 degrees from that of FIG. 21 (representing state "0").

FIG. 20 shows a representative structure of an already known MRAM as one example of the magnetic recording sensor. The magnetic recording sensor has a structure comprising a plurality of cells in parallel including a magnetoresistive sensor layer 2002 for recording information, a bit line 2001 connected to the magnetoresistive sensor layer for flowing an electric current 2003 to the sensor, a word line 2005 (with current 2006) in the position opposite the bit line 2001 by interposing therebetween the magnetoresistive sensor layer 2002 and in the position away tram the magnetoresistive sensor layer 2002 for performing recording operation onto the magnetoresistive sensor layer orthogonally to the bit line, an amplifying system for amplifying a read signal, and a read conductive line 2007 (supported by structures 2004, 2009) for switching between read and write, wherein the magnetoresistive sensor layer 2002 comprises the magnetoresistive sensor layer as shown in Example 1. Since an electric current flows perpendicular to the plane, the use of the magnetoresistive sensor layer is similar to that of Example 1. The magnetoresistive sensor layer has the size consisting of one side of 0.2 to 0.25 $\mu$m. The magnetization of the free layer of the magnetoresistive sensor layer is rotated in the direction of an electric current flowing through the word line and the bit line, by varying the direction of the synthetic magnetic field caused in the magnetoresistive sensor layer portion. When the magnetization direction of the free layer of the magnetoresistive sensor layer is rotated and the magnetic domain is caused in the free layer, the resistance value to the magnetic field is varied to lower the S/N ratio, so that memory cannot be read. In order to controllably perform this, the magnetic domain control layer is required. Magnetic domain control layers having high electric resistivity 2008 devised in the present invention are positioned on opposite ends of the magnetoresistive element layer 2002. Thus, magnetic domain control is possible without loss of shunting to the magnetic domain control layer, so as to improve the recording density of the magnetic recording sensor.

According to the present invention, in the magnetoresistive sensor using the magnetoresistive sensor layer, (1) a loss of shunting to the magnetic domain control layer can be eliminated, (2) the number of conventional processes for manufacturing the magnetic domain control layer can be reduced, and (3) magnetic domain control can be conducted finely by making the gap between the shields smaller since the thickness of the magnetic domain control layer can be reduced by the size of the pressure-resistant protective layer. Accordingly, (4) the magnetoresistive sensor flowing an electric current perpendicular to the plane can provide the magnetic domain control layer practicable. Further, the magnetoresistive sensor of the present invention is used to provide the magnetic head having excellent reproducing resolution and the magnetic disk apparatus.

What is claimed is:

1. A magnetoresistive sensor including a substrate, a pair of magnetic shield layers consisting of a lower magnetic shield layer and an upper magnetic shield layer, a magnetoresistive sensor layer disposed between the pair of magnetic shields, an electrode terminal for flowing a signal current perpendicular to the plane of the magnetoresistive sensor layer, and magnetic domain control layers for controlling Barkhausen noise of said magnetoresistive sensor layer, wherein said magnetic domain control layers disposed on opposite ends of the magnetoresistive sensor layer in a region from the end surface of a media-opposed surface side of the magnetoresistive sensor layer to the depth position are made of a material having a specific resistance not less than 10 mΩcm, and are in contact with at least opposite end surfaces of said magnetoresistive sensor layer in said region;

wherein each magnetic domain control layer of said magnetic domain control layers includes regions of hard magnetic material having high coercivity made of a metal magnetic material having a composition including at least one of the elements of Co (cobalt), Cr (chromium), Pt (platinum), Ta (tantalum), and Nb (niobium), and regions of insulating material made of at least one of Al2O3, SiO2, HfO2, TaO2, TiO2, Ta2O5, AlN, AlSlN, or ZrO2, said each magnetic domain control layer including at least two of the regions of hard magnetic material which are separated from one another.

2. The magnetoresistive sensor according to claim 1, wherein the material consisting of said magnetic domain control layer is a granular layer.

3. A magnetoresistive sensor including a substrate, a pair of magnetic shield layers consisting of a lower magnetic shield layer and an upper magnetic shield layer, a magnetoresistive sensor layer disposed between the pair of magnetic shields, an electrode terminal for flowing a signal current perpendicular to the plane of the magnetoresistive sensor layer, and magnetic domain control layers, wherein a magnetic domain control layer of said magnetic domain control layers is disposed on each of two opposite ends of the magnetoresistive sensor layer in the region from the end surface of the media-opposed surface side of the magnetoresistive sensor layer to the depth position, wherein each said magnetic domain control layer includes regions of a hard magnetic material having high coercivity made of metal magnetic material having a composition including at least one of the elements of Co (cobalt), Cr (chromium), Pt (platinum), Ta (tantalum), and Nb (niobium), and regions of an insulating material made of at least one of Al2O3, SiO2, HfO2, TaO2, TiO2, Ta2O5, AlN, AlSlN, or ZrO2, each said magnetic domain control layer including at least two of the regions of hard magnetic material which are separated from one another.

4. The magnetoresistive sensor according to claim 3, wherein the material consisting of said magnetic domain control layer is a granular layer.

5. A magnetoresistive sensor comprising:
a magnetoresistive sensor layer; and
a magnetic domain control layer on each of two opposite end surfaces of said magnetoresistive layer, each magnetic domain control layer in contact with end surfaces of said magnetoresistive layer and having a specific resistance of not less than 10 mΩcm, and including regions made of a hard metal magnetic material having a composition including at least one of the elements of Co (cobalt), Cr (chromium), Pt (platinum), Ta (tantalum), and Ni (niobium), said each magnetic domain control layer including at least two of the regions of hard magnetic material which are separated from one another.

6. The magnetoresistive sensor according to claim 5, wherein the magnetic domain control layer is a granular layer.

* * * * *